United States Patent
Mathuria et al.

(10) Patent No.: US 10,140,044 B2
(45) Date of Patent: Nov. 27, 2018

(54) EFFICIENT MEMORY BANK DESIGN

(71) Applicant: QUALCOMM Incorporated, San Diego, CA (US)

(72) Inventors: Priyankar Mathuria, Bangalore (IN); Rakesh Kumar Sinha, Bangalore (IN); Gururaj Shamanna, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 182 days.

(21) Appl. No.: 15/086,943

(22) Filed: Mar. 31, 2016

(65) Prior Publication Data

US 2017/0285998 A1 Oct. 5, 2017

(51) Int. Cl.
*G06F 3/06* (2006.01)
*G11C 7/10* (2006.01)
*G11C 8/12* (2006.01)
*G11C 11/419* (2006.01)

(52) U.S. Cl.
CPC .......... *G06F 3/0634* (2013.01); *G06F 3/0613* (2013.01); *G06F 3/0659* (2013.01); *G06F 3/0673* (2013.01); *G11C 7/106* (2013.01); *G11C 8/12* (2013.01); *G11C 11/419* (2013.01); *G11C 2207/005* (2013.01)

(58) Field of Classification Search
CPC .... G06F 3/0613; G06F 3/0634; G06F 3/0659; G06F 3/0673; G11C 11/419; G11C 2207/005; G11C 7/106; G11C 8/12
See application file for complete search history.

(56) References Cited

U.S. PATENT DOCUMENTS

| | | | |
|---|---|---|---|
| 6,070,217 A | 5/2000 | Connolly et al. | |
| 6,108,756 A | 8/2000 | Miller et al. | |
| 6,212,607 B1 | 4/2001 | Miller et al. | |
| 6,310,805 B1 | 10/2001 | Kasa et al. | |
| 6,642,749 B1 | 11/2003 | Wu et al. | |
| 8,285,960 B2 | 10/2012 | Pyeon et al. | |
| 2011/0037511 A1 | 2/2011 | Tokumaru et al. | |
| 2011/0122709 A1* | 5/2011 | Kim | G11C 14/0054 365/189.05 |

(Continued)

FOREIGN PATENT DOCUMENTS

WO 2008055099 A2 5/2008

OTHER PUBLICATIONS

International Search Report and Written Opinion—PCT/US2017/021871—ISA/EPO—dated Jun. 13, 2017.

*Primary Examiner* — Yong J Choe
(74) *Attorney, Agent, or Firm* — Arent Fox, LLP and Qualcomm Incorporated

(57) ABSTRACT

In an aspect of the disclosure, a method and an apparatus are provided. The apparatus may be a memory. The memory may include a first memory portion configured to store a first bit and generate a first data bit output. The first data bit output may be a function of the first bit when a first read enable is active. The memory may also include a second memory portion configured to store a second bit and generate a second data bit output. The second data bit output may be a function of the second bit when a second read enable is active. The memory may include a switch configured to select between the first and second bits for a read operation based on the first and second data bit outputs.

21 Claims, 9 Drawing Sheets

(56) References Cited

U.S. PATENT DOCUMENTS

2014/0145772 A1* 5/2014 Kuenemund ........ H03K 3/0372
                                                    327/202
2014/0321217 A1    10/2014 Song et al.
2016/0379699 A1* 12/2016 Takahashi ........... G11C 11/1673
                                                    365/158

* cited by examiner

EFFICIENT MEMORY BANK DESIGN

BACKGROUND

Field

The present disclosure relates generally to memory circuitry, and more particularly, to a memory circuitry for selecting between memory outputs.

Background

Computers typically employ one or more processors capable of communicating with memory over a bus. Memory is a storage medium that holds the programs and data needed by the processor to perform its functions. Recently, with the advent of more powerful software programs, the demands for more memory have been increasing at an astounding rate. The result is that modern computers require a large amount of memory, which may be slower than the smaller memories. In fact, with respect to memory access speed, processors are currently able to generate memory accesses faster than the access speed of memory. This means that processors may have to wait for program instructions and data to be written to and read from memory.

One approach is to use a multi-bank memory. In one example, a multi-bank memory may generally be thought of as a series of separate memories integrated into the same piece of silicon. In another example, a multi-bank memory may generally be thought of as a series of separate memories integrated into the same memory system. Each memory bank may be addressed individually by the processor as an array of rows and columns. This may enable the processor to read or write program instructions and/or data from/to each memory bank in parallel. The processor may perform a read operation to a particular memory bank by placing a "read command" on the bus instructing the memory bank to retrieve the program instructions and/or data from a block of memory beginning at a specified address. The processor may perform a write operation to a particular memory bank by placing a "write command" on the bus instructing the memory bank to store the program instructions and/or data sent with the write command to a block of memory beginning at a specific address. Multi-bank memory may use a series of multiplexers to select between multiple memories. These multiplexers may generally need enable signals to be routed to them, which may use valuable routing resources.

Some memory systems may include pairs of memory cells. For each pair of memory cells in a set of memory cells, one memory cell of the pair of memory cells may be selected using a multiplexer (mux). The multiplexer may require that a selection signal be routed to the multiplexer. The selection signal may need to be routed to each multiplexer for each pair of bits. Routing a selection signal to a multiplexer for each pair of bits may require a large amount of routing resources on a die implementing the memory.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method and an apparatus are provided. The apparatus may be a memory, including a first memory portion. The first memory portion may be configured to store a first bit and generate a first data bit output as a function of the first bit. The memory may include a second memory portion. The second memory portion may be configured to store a second bit and generate a second data bit output as a function of the second bit. The memory may include a switch. The switch may be configured to select between the first and second bits for a read operation based on the first and second data bit outputs.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive

DETAILED DESCRIPTION

Figure 1:
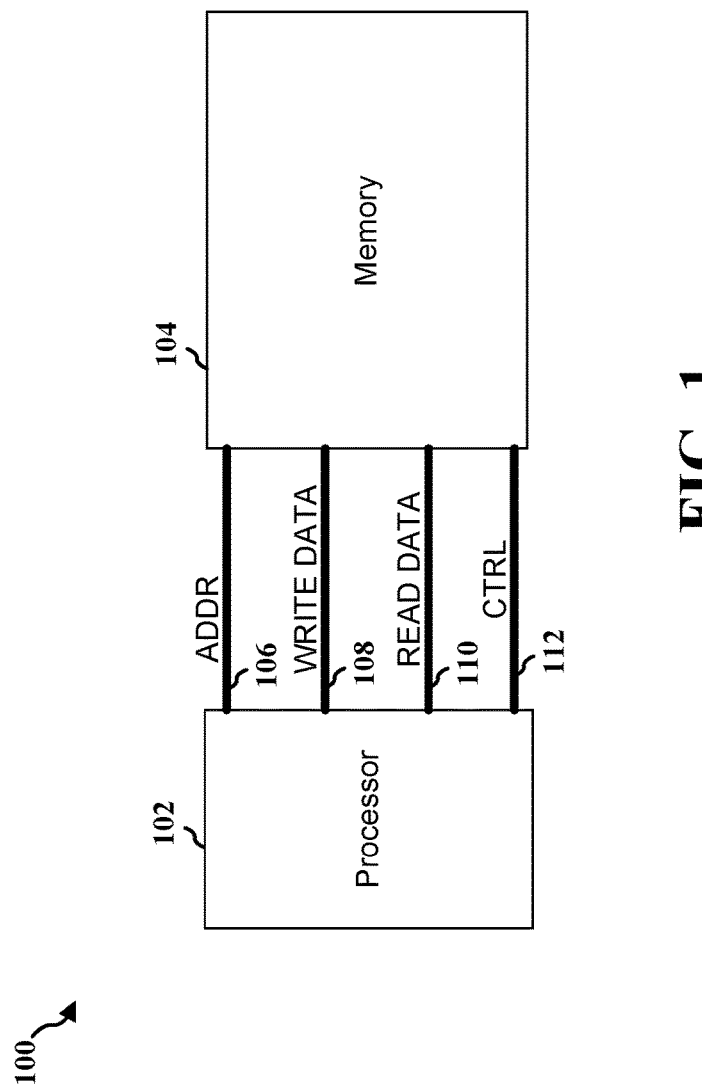
FIG. 1 is a conceptual block diagram illustrating an example of a processing system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. Acronyms and other descriptive terminology may be used merely for convenience and clarity and are not intended to limit any concept disclosed herein.

Various memories presented throughout this disclosure may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of those elements. Rather, these designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Examples of other memories include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, all references to an SRAM are intended only to illustrate exemplary aspects of memory with the understanding that such aspects may be extended to a wide range of applications.

FIG. 1 is a conceptual block diagram illustrating an example of a processing system 100. The processing system 100 includes a processor 102 and a memory 104. The processor 102 may be a microprocessor, microcontroller, digital signal processor (DSP), programmable logic implementing a processor, or other processing circuitry. The memory 104 may be a multibank memory, such as a synchronous dynamic random access memory (SDRAM), or any other multibank component capable of retrieving and storing information.

The processor 102 illustrated in FIG. 1 is connected to the memory 104. The connections between the processor 102 and the memory 104 may include an address bus 106, a write data bus 108, a read data bus 110, and a control bus 112. The write data bus 108 may be used to write data from the processor 102 to the memory 104. The control bus 112 may include signals used to control the writing of data from the processor 102 to the memory 104. The read data bus 110 may be used to read data from the memory 104 to the processor 102. The control bus 112 may include signals used to control the reading of data from the memory 104 to the processor 102. For example, the control bus 112 may include signals such as a read signal and a write signal. The read signal may be a single signal line, e.g., a single bit, that indicates when the memory is being read by the processor 102. The write signal may be a single signal line that indicates when the memory is being written by the processor 102. In some examples, the control bus 112 may also include a byte enable signal. The byte enable signal may be a group of signal lines that indicate the size of the data, e.g., 8, 16, 32, 64 bytes. In some examples, however, the size of the data may be fixed, e.g., one of 8, 16, 32, 64 bytes. Accordingly, the byte enable signal may be optional on the control bus 112.

Other optional signals that may be part of the control bus 112 include, but are not limited to, transfer acknowledgment (ACK), bus request, bus grant, interrupt request, one or more clock signals, and a reset signal. The transfer acknowledge signal may indicate that data is acknowledged by a device, e.g., the processor 102, as having been read. The bus request may indicate that a device, e.g., the processor 102 or the memory 104 is requesting the bus, e.g., the processor 102 or the memory 104 is requesting use of the address bus 106 and one of the write data bus 108 or the read data bus 110. The bus grant may indicate that the processor 102 has granted access to the bus. The interrupt request may indicate to the processor 102 that a lower priority device is requesting the bus. Any clock signals on the control bus 112 may be used to synchronize devices on the control bus 112 such as the processor 102, the memory 104, or both. The reset may be used to reset the processor 102, the memory 104, or both. The signals described above as optional may not be used in the example systems described herein, but may be used in a particular implementation of the systems and methods described.

The control bus 112 may include a read signal and a write signal. The read signal and the write signal may be used to generate a read enable and a write enable, respectively, within the memory 104 as will be discussed in greater detail with respect to FIG. 3.

The address bus 106 may be used to indicate which location within the memory 104 the processor is reading or writing. For example, if the processor 102 wishes to read a memory location in the memory 104 the processor 102 may output the address of the memory location on the address bus 106. Additionally, the processor 102 may drive the read signal, which may be part of the control bus 112, active. The memory 104 may then output the data in the memory location indicated by the address bus 106 on the read data bus 110. Similarly, if the processor 102 wishes to write a memory location in the memory 104, the processor may output the address of the memory location to be written on the address bus 106. Additionally, the processor 102 may drive the write signal, which may be part of the control bus 112, active. The processor 102 may drive the write data bus 108 with the data that is to be written to the memory 104.

The write data bus 108 and the read data bus 110 are illustrated as separate buses in FIG. 1. It will be understood however, that in other examples a single bidirectional data bus may be used to write data from the processor 102 to the memory 104 and to read data from the memory 104 to the processor 102. Systems using a single bidirectional data bus may be used to write data from the processor 102 to the memory 104 and to read data from the memory 104 to the processor 102 may include various control signals to allow for the use of a single bidirectional data bus, such as a read/write signal and a data valid signal. The read/write signal may indicate when data is being read or written. The data valid signal may indicate if data on the bidirectional data bus is valid data.

Figure 2:
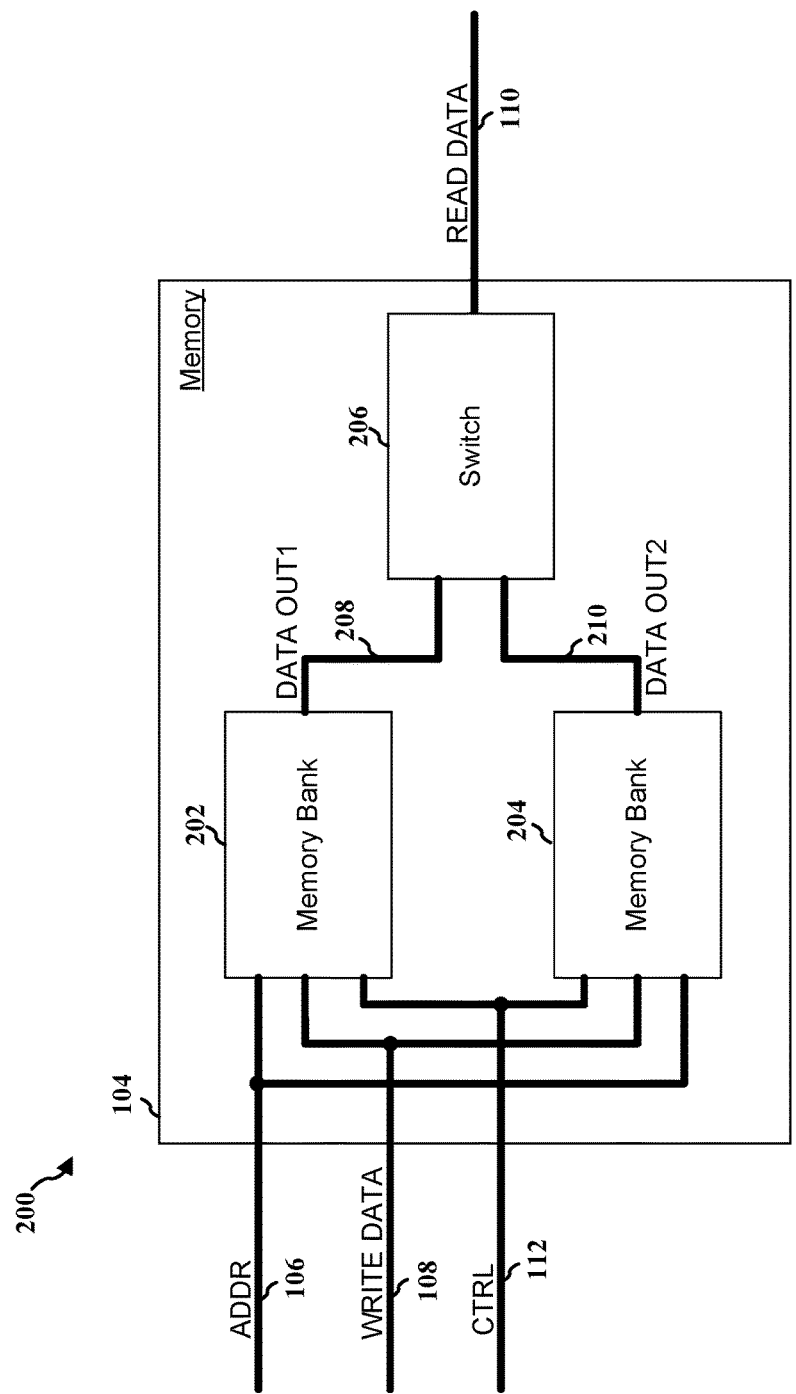
FIG. 2 is a conceptual block diagram illustrating the example memory of FIG. 1.

FIG. 2 is a conceptual block diagram 200 illustrating the example memory 104 of FIG. 1. The memory 104 is connected to the address bus 106, the write data bus 108, the read data bus 110, and the control bus 112. The memory 104 includes a first memory bank 202 and a second memory bank 204. The first memory bank 202 and the second memory bank 204 are each connected to the address bus 106, the write data bus 108, and the control bus 112. Accordingly, the memory banks 202, 204 may be written by the processor 102 of FIG. 1.

The output 208 of the first memory bank 202 may be connected to a switch 206.

The output 210 of the second memory bank 204 may also be connected to the switch 206. The switch 206 may be used to select between the output 208 of the first memory bank 202 and the output 210 of the second memory bank 204. Depending on which output 208, 210 is selected, data from the first memory bank 202 or data from the second memory bank 204 may be output on the read data bus 110. The switch 206 may select between the output 208 and the output 210 based on the data that may be on the output 208 and the output 210 in accordance with the systems and methods described herein. For example, each bit of the output 208 and the output 210 may be differential. When a memory bank 202, 204 is outputting valid data, each bit of the output may be the inverse of the other. (The output may be a differential pair.) As used herein, the "differential" data outputs described herein are generally not true differential outputs, i.e., the differential data outputs are not at different levels all of the time. The differential data outputs of a memory bank, in the examples described herein, may either both be a logic high or may be the inverse of each other. Furthermore, the "differential" data outputs, in the examples described herein, may generally be full swing signals, e.g., logic high or logic low.

When a memory bank 202, 204 is not outputting valid data each bit of the output is not the inverse of the other. In one aspect, both outputs may be high, e.g., a logic level "1." In another aspect both outputs may be low. Accordingly, the switch 206 may determine when one of the memory banks 202, 204 is outputting valid data based on the status of the output pairs making up the data from the memory banks 202, 204. When the output pairs from the memory bank 202 are the inverse of each other, the memory bank 202 may be selected by the switch 206 and the memory bank 204 may not be selected by the switch 206. When the output pairs from the memory bank 204 are the inverse of each other, the memory bank 204 may be selected by the switch 206 and the memory bank 202 may not be selected by the switch 206.

Figure 3:
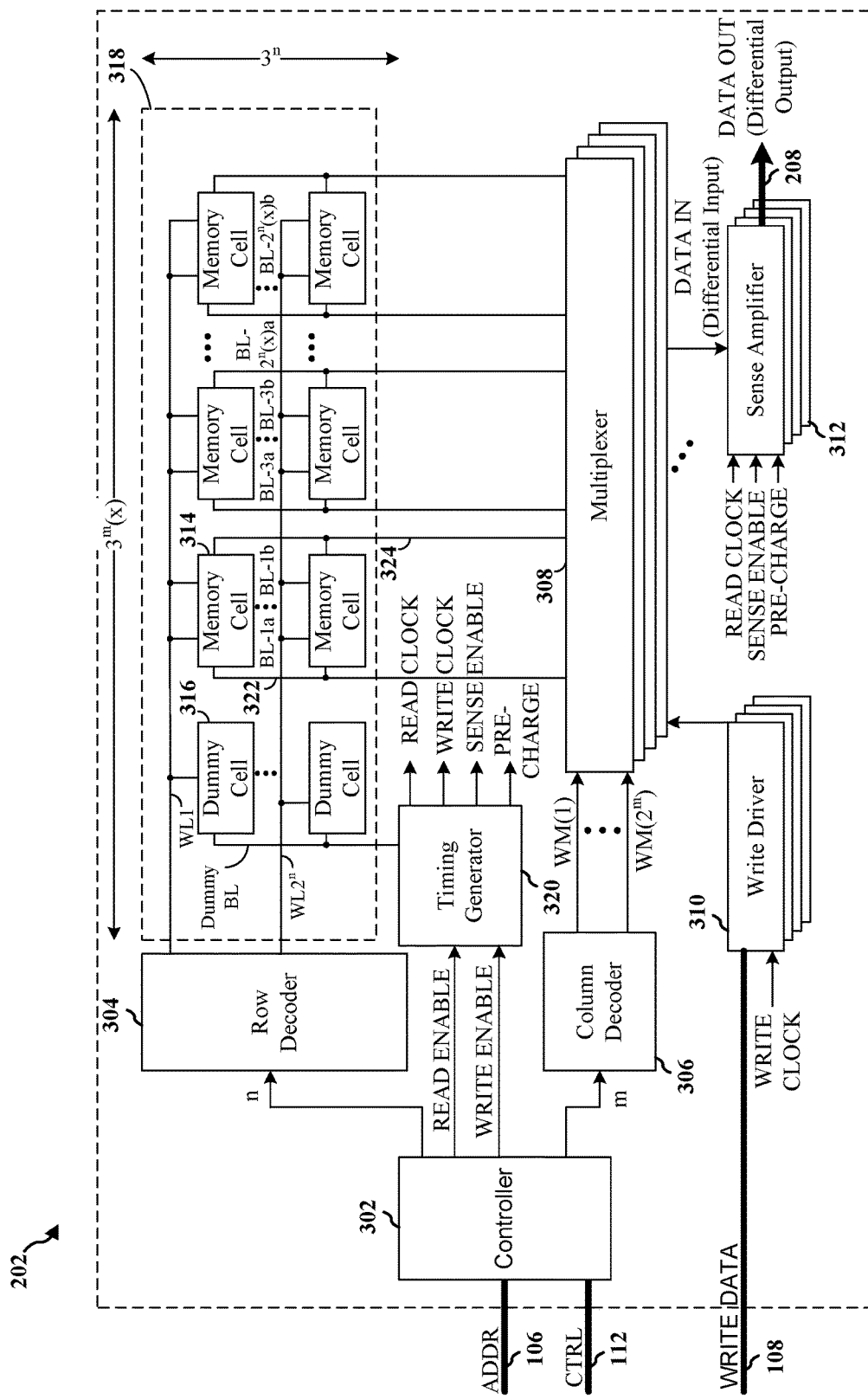
FIG. 3 is a functional block diagram of an exemplary embodiment of an SRAM.

FIG. 3 is a functional block diagram of an exemplary embodiment of a memory bank 202. The memory bank may be a static random-access memory (SRAM). The memory bank 202 may include a memory array 318 with supporting circuitry to decode addresses and perform read and write operations. The memory array 318 may be comprised of memory cells 314 for storing data. For example, the memory cell 314 may be a bit cell storing a bit of data. Accordingly, a memory cell such as memory cell 314 in memory bank 202 may provide a means for storing a first bit. Similarly, another memory cell, generally in another memory bank 204, may provide a means for storing a second bit.

The memory cell 314 may be arranged to share connections in horizontal rows and vertical columns. Specifically, each horizontal row of memory cells 314 may share a wordline WL, and each vertical column of memory cells 314 may share a pair of bitlines (e.g., BL-1a and BL-1b). The size of the memory array 318 (i.e., the number of cells) may vary depending on a variety of factors including the specific application, the speed requirements, die layout constraints and testing requirements, and the overall design constraints imposed on the system. The memory array 318 may contain thousands or millions of memory cells.

In the exemplary embodiment of the memory bank 202 shown in FIG. 3, the memory array 318 may include (2n·2m(x)) memory cells 314 arranged in 2n horizontal rows and 2m (x) vertical columns, where 2m is the number of words per row and x is the number of bits per word. A peripheral device (not shown) may randomly access any word (i.e., x cells) in the memory array 318 using an (n+m) bit wide address that is provided through a controller 302 to a row decoder 304 and column decoder 306, respectively. As will be described in greater detail later, the controller 302 may be responsible for the memory read and write operations. For example, the controller may provide the timing for the read and write operations in memory a cycles. The output from the controller 302 may includes an n-bit address provided to the input of a row decoder 304, and an m-bit address provided to the input of a column decoder 306. The column decoder 306 provides 2m outputs (WM(1)-WM(2m)) with a different one of the outputs asserted for each different combination of address inputs.

The outputs are provided to x multiplexers 308. For a write memory access, each multiplexer is a 2m:1 multiplexer which switches one of x inputs from a write driver 310 between 2m bitline pairs based on the outputs from the column decoder 306. By way of example, a memory array that stores four (4) 128-bit words per row requires 128 4:1 multiplexers. Each multiplexer input is coupled to one of 328 outputs from the write driver 310. Based on the decoded m-bit address, each multiplexer input may be coupled from the write driver 310 to one of 4 bitline pairs. The 4 bitline pairs may be coupled to four memory cells, each storing a corresponding bit for a different word in a row. For example, the first of the 4 memory cells may store the least significant bit (LSB) of the first word, the second of the 4 memory cells may store the LSB of the second word, the third of the 4 memory cells may store the LSB of the third word, and the fourth of the 4 memory cells may store the LSB of the fourth word.

Thus, when the WRITE ENABLE signal from the controller 302 is asserted, the write driver 310 outputs the Write Data received from the peripheral device (not shown) to x pairs of bitlines BL-a and BL-b with each of the x multiplexers driving one pair of bitlines (e.g., BL-1a and BL-1b). The row decoder 304 converts the n-bit address into 2n wordline outputs. A different wordline WL is asserted by the row decoder 304 for each different n-bit row address. As a result, each of the 2m(x) memory cells 314 in the horizontal row with the asserted wordline WL is connected to one pair of the 2m(x) bitlines (e.g., BL-1a and BL-1b) through each memory cells 314 access transistors, as will be described in more detail below with reference to FIG. 4. The write data is driven, through the x multiplexers 308, onto the selected pairs of bitlines (e.g., BL-1a and BL-1b) and written to the memory cells with the asserted wordline WL.

For a read memory access, the row decoder 304 converts the n-bit address into one of the 2n read wordlines. A different read wordline WL is selected by the row decoder 304 for each different n-bit row address. As a result, each of the 2m(x) memory cells in the horizontal row with the selected read wordline WL is connected to one of the 2m(x) read bitlines BL through its access transistor, as will be described in more detail below with reference to FIG. 4. The 2m(x) read bitlines BL are used to transmit the bits stored by the 2m(x) memory cells to the x multiplexers 308, with each multiplexer 308 selecting one bit from the 2m bits transmitted on the read bitlines BL to the input of that multiplexer 308. The selected bits from the x multiplexers 308 are provided to the sense amplifier 312 for outputting the dataout signal 208. Accordingly, a sense amplifier, such as the sense amplifier 312 in memory bank 202 may provide a means for generating a first data bit output as a function of the first bit when a first read enable is active. Another sense amplifier, generally in another memory bank 314, may provide a means for generating a second data bit output as a function of the first bit when a first read enable is active. After the READ ENABLE signal generated by the controller 302 is asserted, the selected bits are ready for the sense amplifier 312. The READ ENABLE from the controller 302 may be used to generate the READ CLOCK. Additionally, the controller 302 may generate the n and m signals for the row and column decoders, respectively. Data from the multiplexer 308 into the sense amplifier 312 (DATA IN) may be available after the bitline BL and the wordline WL are selected, e.g., based on the n and m signals, and after the READ CLOCK is generated. Generally, there may be a delay from when the bitline BL and the wordline WL and the READ CLOCK are selected and when data from the multiplexer 308 into the sense amplifier 312 (DATA IN) is available because accessing the memory and propagating through the multiplexer 308 may take time.

As mentioned earlier, the controller 302 is responsible for PDP memory operation by providing the timing for the read and write operations in a memory cycle. The memory cycle may be defined by the SYSTEM CLOCK input to the controller 302. The timing of the read and write operation is derived from internal READ and WRITE CLOCKS that are used to respectively multiplex READ and WRITE ADDRESS inputs from a peripheral device to the address decoder (i.e., row decoders 304 and column decoders 306). The READ clock is set by the READ ENABLE and reset by the READ CLOCK RESET. Similarly, the WRITE CLOCK is set by the WRITE ENABLE once the read operation is complete and reset by the WRITE CLOCK RESET. The READ and WRITE ENABLES may be input to the controller 302 from a peripheral device and controlled by the peripheral device. The READ CLOCK and WRITE CLOCK RESET may be generated by a tracking circuit in the memory array 318 and input to the controller 302. The READ ENABLE may be used to generate the READ CLOCK. The WRITE ENABLE may be used to generate the WRITE CLOCK. The READ CLOCK may be generated by the timing generator 320. The timing generator 320 may be configured to control the timing of the READ CLOCK so that the sense amplifier 312 is active when the DATA IN signal(s) are valid. Similarly, the timing generator 320 may be configured to control the timing of the WRITE CLOCK so that the Write Driver 310 is active when the DWRITE DATA signal(s) are valid.

As used herein, the terms "set" and "reset" with respect to a clock or other signal may describe two different logic states of such clock or other signal regardless of polarity. By way of example, a clock or other signal may be described as having a high logic state (e.g., a logic level "1") when set and a low logic state (e.g., logic "0") when reset. Alternatively, the clock or other signal may be described as having a low logic state when set and a high logic state when reset, as might be the case with an inverted clock or signal. Accordingly, the terms "set" and "reset" as used herein shall have no defined polarity, but rather shall be construed broadly to mean different logic states with reference to one another.

In the described exemplary embodiment, the tracking circuit may include a column of dummy cells, e.g., dummy cell 316, in the memory array. Dummy cells, such as dummy cell 316, may be used to determine when data from a memory cell, such as memory cell 314, is valid. Each dummy cell 316 is configured to emulate the operation of a row of memory cells 314. Each dummy cell 316 is connected to the same WL for its row of memory cells 314. (Accordingly, there may be a dummy cell for each row so that each row may be monitored based on that row's dummy cell, e.g., dummy cell 316.) A timing generator 320 may be used to monitor the Dummy bit line (BL) from the dummy cell 316 connected to the asserted WL. Specifically, the timing generator threshold detects the Dummy BL to track the access time of the selected memory cell 314 during read and/or write operations.

By way of example, during a read operation, the timing generator 320 monitors the dummy BL and may reset the READ CLOCK when a known bit stored in the dummy cell 316 appears on the Dummy BL. (For example, the timing generator 320 may monitor the dummy BL to determine when the dummy BL changes from one logic state to another logic state. The change in logic state may indicate that data on the corresponding memory cell bit lines is valid.) Similarly, during a write operation, the timing generator 320 monitors the Dummy BL and resets the WRITE CLOCK when a known bit written to the dummy cell by the write driver 310 appears on the Dummy BL. (For example, the timing generator 320 may monitor the dummy BL to determine when the dummy BL changes from one logic state to another logic state. The change in logic state may indicate that data on the corresponding memory cell bit lines is valid.) In at least one exemplary embodiment, the timing generator 320 may also be used to generate a WRITE READY signal. The WRITE READY signal may be used by the controller to satisfy certain internal timing constraints of the write operation following the read operation. Each memory cell 314 is configured to store one bit of data (e.g., a logic level "1" or a logic level "0").

Figure 4:
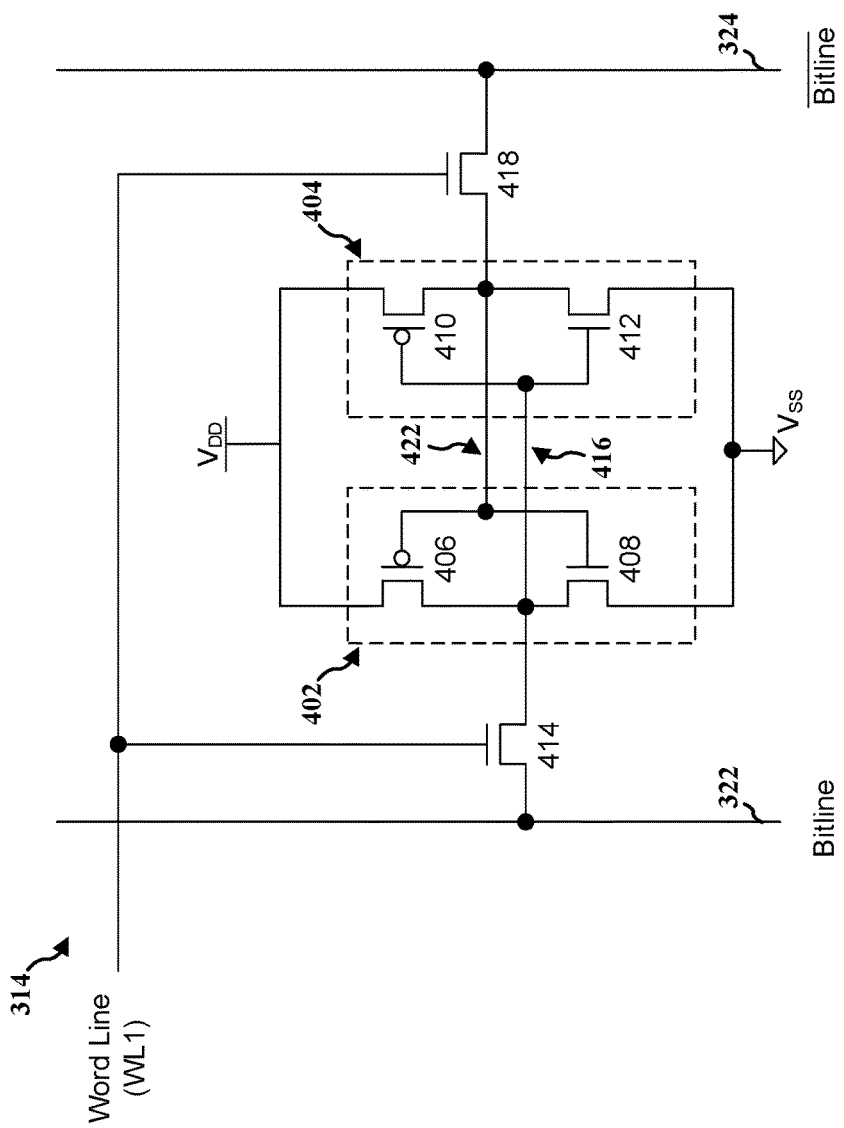
FIG. 4 is a schematic diagram of an exemplary embodiment of a memory cell for an SRAM.

FIG. 4 is a schematic diagram of an exemplary embodiment of the memory cell 314 of FIG. 3 of a memory bank, e.g., memory bank 202 of FIG. 2. The memory cell 314 illustrated in FIG. 4 is a six-transistor (6T) configuration. However, as those skilled in the art will readily appreciate, the memory cell 314 may be implemented with a four-transistor (4T) configuration, an eight transistor (8T) configuration, a ten transistor (10T) configuration, or any other suitable transistor configuration that may be used to implement a memory cell.

The memory cell 314 is shown with two inverters 402, 404. The first inverter 402 comprises a p-channel metaloxide-semiconductor field effect (PMOS) 406 and an n-channel metal-oxide-semiconductor field effect (NMOS) 408. The second inverter 404 comprises a PMOS transistor 410 and an NMOS transistor 412. In the described embodiment, the inverters 402 and 404 are powered by VDD and have a return VSS (e.g., ground). The first inverter 402 and the second inverter 404 are interconnected to form a cross-coupled latch. A first NMOS access transistor 414 couples the output node 416 from the second inverter 404 to a bitline BL-a, and a second NMOS access transistor 418 couples the output node 420 from the first inverter 402 to a bitline BL-b (the value of which is the opposite or inverse of the bitline BL-a). The gates of the NMOS access transistors 414, 418 are coupled to a wordline WL.

A write operation may be performed by setting the bitlines BL-a and BL-b to the value to be written to the memory cell 314 and asserting the wordline WL. The wordline WL may be asserted before the value to be written (e.g., write data) is provided to the bitlines BL-a and BL-b. By way of example, a low value, e.g., a logic level "1" may be written to the memory cell 314 by setting the bitline BL-a to a logic level 0 and the bitline BL-b to a logic level "1." The logic level 0 at the bitline BL-a is applied to the inerter 404 through the NMOS access transistor 414, which in turn forces the output node 420 of the second inverter 404 to VDD. The output node 420 of the second inverter 404 is applied to the input of the first inverter 402, which in turn forces the output node 416 of the first inverter 402 to VSS. A logic level 0 may be written to the memory cell 314 by inverting the values of the bitlines BL-a and BL-b. The write driver 310 may be designed to be stronger than pull-up transistors (406 and 410) in the memory cell 314 so that the write driver 310 can override the previous state of the cross-coupled inverters 402, 404.

Once the write operation is complete, the wordline is de-asserted, thereby causing the NMOS access transistors 414 and 418 to disconnect the bitlines BL-a and BL-b from the two inverters 402, 404. The cross-coupling between the two inverters 402, 404 maintains the state of the inverter outputs as long as power is applied to the memory cell 314.

The memory cell 314 stores data according to the data values stored at nodes 416 and 420. If the memory cell 314 stores a logic high (i.e., a '1'), then node 416 is at a logic high and node 420 is at a logic low (i.e., a '0'). If the memory cell 314 stores a logic low, then node 416 is at a logic low and node 420 is at logic high. During a read operation, differential bit lines BL-1*a* and BL-1*b* may be pre-charged by a pre-charge circuit. The word line WL is then asserted, thereby turning on NMOS access transistors 414, 418. The timing between the pre-charging and asserting the wordline WL may be controlled by the row decoder 304.

If memory cell 314 stores a logic high, then bit line BL-1a remains charged via NMOS access transistor 414, and complimentary bit line BL-1b is discharged via NMOS transistor 418. If memory cell 314 stores a logic low, then bit line BL-1*a* is discharged via NMOS access transistor 414, and complimentary bit line BL-1*b* remains charged via NMOS access transistor 418.

Figure 5:
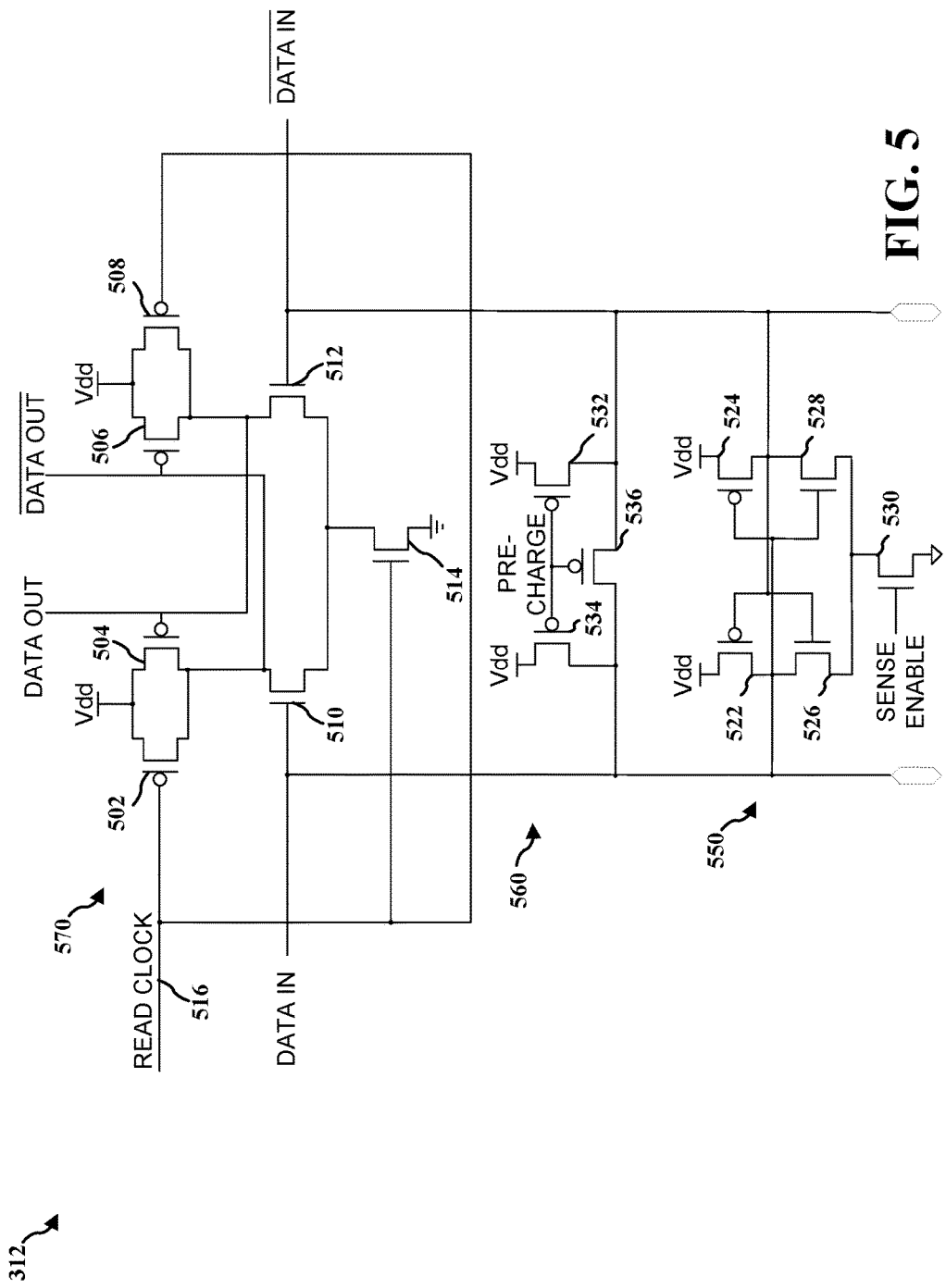
FIG. 5 is a conceptual block diagram illustrating an example of the sense amplifier of FIG. 3.

FIG. 5 is a conceptual block diagram illustrating an example of the sense amplifier, e.g., sense amplifier 312 of FIG. 3. The example sense amplifier 312 may include sense amplifier circuitry 550, pre-charge circuitry 560, dynamic level shifter circuitry 570, or some combination of the sense amplifier circuitry 550, the pre-charge circuitry 560, or the dynamic level shifter circuitry 570. Other examples may provide data directly from the multiplexer 308 of FIG. 3. In other words, the sense amplifier 312 may be optional in some example memory banks 202. Various combinations of one, two, or all three of the sense amplifier circuitry 550, the pre-charge circuitry 560, or the dynamic level shifter circuitry 570 may be used. The example sense amplifier 312 may be used to generate the differential dataout from the first memory bank 202 or the second memory bank 204.

The sense amplifier 312 in the illustrated example of FIG. 5 includes the sense amplifier circuitry 550. The sense amplifier circuitry 550 includes PMOS transistors 522, 524, and NMOS transistors 526, 528, 530. When the sense enable signal is high, the NMOS transistor 530 will be on. When the NMOS transistor 530 is on, a pair of cross coupled inverters, formed by PMOS transistor 522 and NMOS transistor 526, and formed by PMOS transistor 524 and NMOS transistor 528, are connected between power (Vdd) and ground. The cross coupled inverter (PMOS transistor 522 and NMOS transistor 526) inverts the data in signal and drives the inverse data in signal. Similarly, the cross coupled inverter (PMOS transistor 524 and NMOS transistor 528) inverts the inverse data in signal and drives the data in signal. Accordingly, the data in signal and the inverse data in signal will be driven to the inverse of each other when the sense enable signal is active. When the sense enable signal is inactive (low), the NMOS transistor 530 will be off and the pair of cross coupled inverters are not connected between power (Vdd) and ground. Accordingly, the cross coupled inverters will be unpowered and will not drive the data in signal and the inverse data in signal.

The sense amplifier 312 in the illustrated example of FIG. 5 includes the pre-charge circuitry 560. The pre-charge circuitry 560 includes PMOS transistors 532, 534, 536. When the pre-charge signal, which is an active low signal in the illustrated example, is active, each of the PMOS transistors 532, 534, 536 is on. When each of the PMOS transistors 532, 534, 536 is on, a data in signal and an inverse data in signal is pulled high. The data in signal is pulled high through PMOS transistor 534 as well as through PMOS transistors 536, 532. The inverse data in signal is pulled high through PMOS transistor 532 as well as through PMOS transistors 536, 534. The data in signal and the inverse data in signal are coupled together through the PMOS transistor 536 when it is active. When the pre-charge signal is not active, each of the PMOS transistors 532, 534, 536 is off. When each of the PMOS transistors 532, 534, 536 is off the data in signal and the inverse data in signal are not pulled high by the pre-charge circuitry 560, nor are the data in signal and the inverse data in signal coupled together through the PMOS transistor 536 (which is off).

The sense amplifier 312 in the illustrated example of FIG. 5 includes the dynamic level shifter circuitry 570. The dynamic level shifter circuitry 570 includes PMOS transistors 502, 504, 506, 508 and NMOS transistors 510, 512, 514. When the read clock signal is low the PMOS transistors 502, 508 are active. Accordingly, the dataout signal and the inverse dataout signal will both be high because the dataout signal is pulled high through the PMOS transistor 508 and the inverse dataout signal is pulled high through PMOS transistor 502. Note that because both of the dataout and the inverse dataout signals are high the PMOS transistors 504, 506 is off. Additionally, at the same time, the NMOS transistor 514, which is connected to the read clock signal is off, which prevents Vdd from shorting to ground (if one of NMOS transistors 510, 512 are active). When the read clock signal is low, the corresponding memory bank 202, 204 is not selected.

When the read clock signal is high, the PMOS transistors 502, 508 are off and the NMOS transistor 514 is on. One of the dataout or inverse dataout signals is pulled low through the NMOS transistor 514 and by one of the NMOS transistors 510 or 512 depending on the state of the data in signal and the inverse data in signal. For example, assuming the data in signal is high and the inverse data in signal is low, the inverse dataout signal is pulled low through NMOS transistor 510 and NMOS transistor 514. The dataout signal will remain high because the NMOS transistor 512 is not on and thus, the dataout signal is not pulled low. Similarly, if the data in signal is low and the inverse data in signal is high, the dataout signal is pulled low through the NMOS transistor 512 and the NMOS transistor 510 will not be on. Accordingly, the inverse dataout signal will remain high because the inverse dataout signal is not pulled low by the NMOS transistor 510 and the NMOS transistor 514.

As described above, when the read clock signal is low, the dataout signal and the inverse dataout signal are both high. When the read clock signal is high, the dataout signal and the inverse dataout signal is the inverse of each other assuming that the data in signal and the inverse data in signal are also the inverse of each other. Accordingly, the state of the dataout signal, the state of the inverse dataout signal, or the state of both signals may be used by the switch 206 of FIG. 2 to determine which memory bank 202, 204 to select. When the dataout signal and the inverse dataout signal are the inverse of each other, the memory bank may be considered to be actively driving the data lines. When the dataout signal and the inverse dataout signal are not the inverse of each other, the memory bank is not actively driving the data lines. Generally, the previous read data value may be retained on the data lines in the illustrated example.

Figure 6:
FIG. 6 is an example timing diagram illustrating timing for the proposed design in accordance with the systems and methods described herein.

FIG. 6 is an example timing diagram 600 illustrating timing for the proposed design in accordance with the systems and methods described herein. As illustrated in the example timing diagram 600, initially, the signals, precharge, sense enable, and read clock may be low. Read data, e.g., read data 110, may be equal to the value from the last read operation, floating, or some other value or values.

Pre-charge, which is active low in the illustrated example, is initially active. Sense enable and read clock are active high in the illustrated example and are initially inactive. As discussed with respect to FIG. 5, driving the pre-charge signal low pulls the data in signal and the inverse data in signal high through the PMOS transistors 532, 534, 536. Pulling the data in signal and the inverse data in signal high through the PMOS transistors 532, 534, 536, pre-charges the data in and inverse data in signals, each to a high value.

When a read is to occur, the pre-charge signal may be driven high (inactive). The timing generator 320 illustrated in FIG. 3 may drive the sense enable signal high (active). As discussed with respect to FIG. 5, driving the sense enable signal high turns the NMOS transistor 530 on. When the NMOS transistor 530 is on, a pair of cross coupled inverters is connected between power (Vdd) and ground. Accordingly, the data in signal and the inverse data in signal will be driven to the inverse of each other when the sense enable signal is active. The cross coupled inverters amplify and reinforce the output from the multiplexer 308.

During a read, after the sense enable signal is driven low by the timing generator 320, the pre-charge signal may be driven low and the read clock signal may be driven high (active) by the timing generator 320. Driving the read clock high activates the level shift circuitry 570. The level shift circuitry may be used to convert memory voltage levels to a proper voltage level for the particular circuitry connected to the memory, e.g., the switch 206. As the read clock signal is driven high the data out may be latched into the switch 206. In some examples, the read data may be stable until the next read operation.

Figure 7:
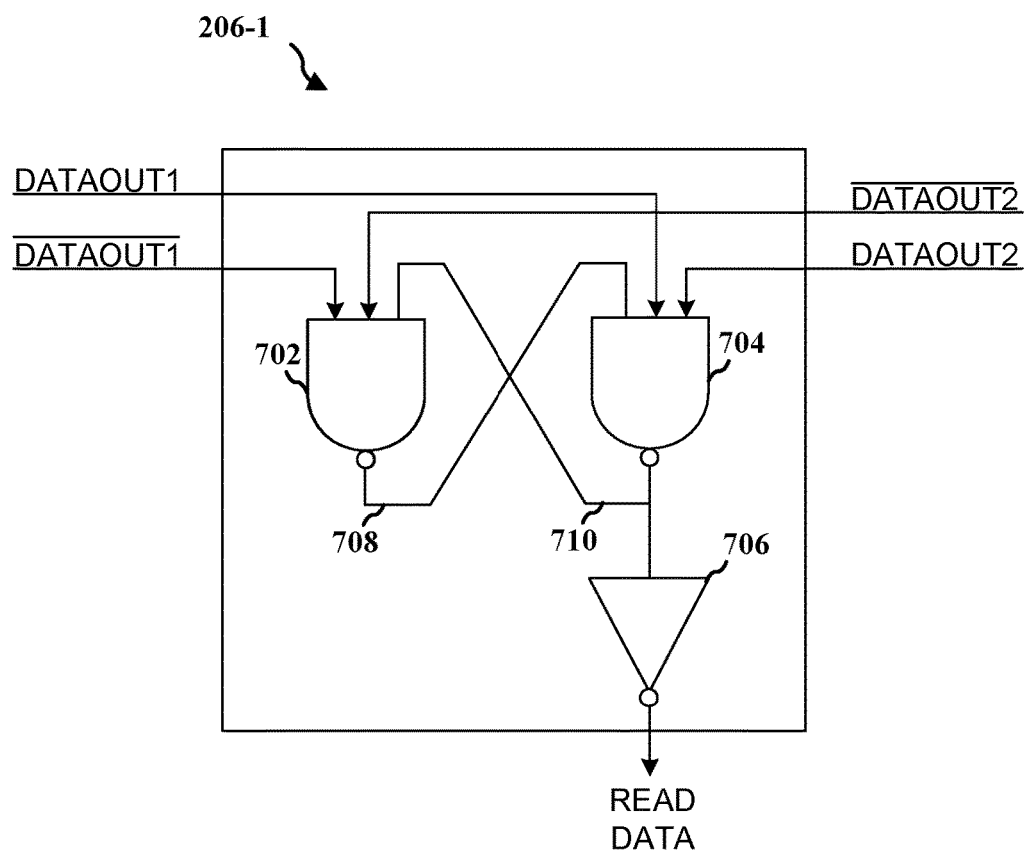
FIG. 7 is a circuit diagram illustrating an example of the switch of FIG. 2.

FIG. 7 is a circuit diagram illustrating an example of a single bit switch 206-1. The single bit switch 206-1 may be a portion of the switch 206 of FIG. 2. The switch 206 of FIG. 2 may include multiple single bit switches 206-1, e.g., when a memory banks, e.g., memory bank 202, 204, output multiple bits. Alternatively, the switch 206 of FIG. 2 may include only one single bit switch 206-1, e.g., when the memory banks 202, 204 output a single bit.

The single bit switch 206-1 includes a NAND gate 702, a NAND gate 704, and an inverter 706. The NAND gates 702, 704 are three input NAND gates. The single bit switch 206-1 illustrated in FIG. 6 may be used to select between two output bits, one output bit from each of the two memory banks 202, 204 illustrated in FIG. 2.

As described above, the "differential" data outputs described herein are generally not true differential outputs, i.e., the differential data outputs are not at different levels all of the time. The differential data outputs of a memory bank, in the examples described herein, may either both be high or may be the inverse of each other. For example, assume that dataout1 is high and inverse dataout1 is low while dataout2 is high and inverse dataout2 is also high. In such a case, at least two of the three inputs to the NAND gates 704 are high and at least one of the inputs to NAND gate 702 (inverse dataout1) is low. Because at least one of the inputs to the NAND gate 702 is low the output of NAND gate 702 is high. Accordingly, the signal 708 is high and all of the inputs to the NAND gate 704 are high. Because all of the inputs to the NAND gate 704 are high, the output of the NAND gate is low and the signal 710 is low. With the signal 710 low, read data, which is an output of the single bit switch 206-1, is high because the read data output signal is an inverted version of the signal 710 which is generated using the inverter 706.

As another example, assume that the output dataout1 is low and the output inverse dataout1 is high. Further assume that the output dataout2 is high and the output inverse dataout2 is also high. In such a case, at least two of the three inputs to the NAND gate 702 are high and at least one of the inputs to NAND gate 704 (dataout1) is low. Because at least one of the inputs to the NAND gate 704 is low, the output of the NAND gate 704 must be high. If the output of the NAND gate 704 is high, then the signal 710 is high. With the signal 710 high, read data, which is an output of the single bit switch 206-1, is low because the read data output signal is an inverted version of the signal 710 which is generated using the inverter 706. With the signal 710 high, all of the inputs to the NAND gates 702 are high. Because all of the inputs to the NAND gates 702 are high, the output of the NAND gate 702 is low and the signal 708 is low. As described above, the switch 206-1 may be used to select between two output bits (e.g., dataout1 and dataout2), one output bit from each of the two memory banks 202, 204 illustrated in FIG. 2. Accordingly, the switch 206-1 may provide means for selecting between the first and second bits for a read operation based on the first and second data bit outputs.

In the example switch illustrated in FIG. 7, the data provided to the switch controls the switch. When dataout1 and inverse dataout1 are both high, the corresponding memory bank is not providing data. When dataout2 and inverse dataout2 are both high, the corresponding memory bank is not providing data. Conversely, when dataout1 and inverse dataout1 are the inverse of each other, the corresponding memory bank is providing data and when dataout2 and inverse dataout2 are the inverse of each other, the corresponding memory bank is providing data.

It will be understood by a person of ordinary skill in the art that other circuits may be used with other memory systems that may use other voltage output combinations. For example, in another memory system two low voltages may indicate that the corresponding memory bank is not providing data, rather than two high voltages. Alternatively, in another system, two low voltages may indicate a low data value, two high voltages may indicate a high data value, and inverse voltage values may indicate that the corresponding memory bank is not providing data. It will be understood by a person of ordinary skill in the art that other circuits, systems, apparatus, and methods may be used, depending on the nature of the particular memory system used. Various circuits, systems, apparatus, and methods may be designed to use the state of a memory bank's outputs to select which memory bank is providing valid data regardless of the specific voltage output combinations used to indicate the presence of data or a lack of data.

Some examples, as described herein include a memory (104). The memory (104) may include a first memory portion (memory cell 314) configured to store a first bit and generate a first data bit output, the first data bit output being a function of the first bit when a first read enable is active. The memory (104) may include a second memory portion (memory cell 314) configured to store a second bit and generate a second data bit output, the second data bit output being a function of the second bit when a second read enable is active. The memory (104) may include a switch (206, 206-1) configured to select between the first and second bits for a read operation based on the first and second data bit outputs. In some examples, the switch (206, 206-1) comprises a latch.

The memory (104) may include a first memory bank (202, 204) including the first memory portion and a second memory bank (202, 204) including the second memory portion. The first memory portion (memory cell 314) may include a first sense amplifier (312) configured to generate the first data bit output. The second memory portion (memory cell 314) may include a second sense amplifier (312) configured to generate the second data bit output. The first sense amplifier (312) may be configured to generate the first data bit output further as a function of a first read enable for a read operation from the first memory portion (memory cell 314). The second sense amplifier (312) may be configured to generate the second data bit output further as a function of a second read enable for a reads operation from the second memory portion (memory cell 314).

In one example, the first sense amplifier (312) may be configured to provide the first bit as the first data bit output when the first read enable is active, and wherein the second sense amplifier is configured to provide the second bit as the second data bit output when the second read enable is active. In an example, the first sense amplifier (312) may be configured to force the first data bit output to a state independent of the first bit when the first read enable is inactive. The second sense amplifier (312) may be configured to force the second output to a state independent of the second bit when the second read enable is inactive. In an example, the first sense amplifier (312) may be configured to provide the first bit as the first data bit output when the first read enable is active. The second sense amplifier (312) may be configured to force the second data bit output to a state independent of the second bit when the second read enable is inactive.

An example memory (104) may include a first memory portion (memory cell 314) configured to store a first bit and generate a first data bit output as a function of the first bit. The example memory (104) may include a second memory portion (memory cell 314) configured to store a second bit and generate a second data bit output independent of the second bit. The example memory (104) may include a switch (206, 206-1) configured to select between the first and second bits for a read operation based on the first and second data bit outputs.

Figure 8:
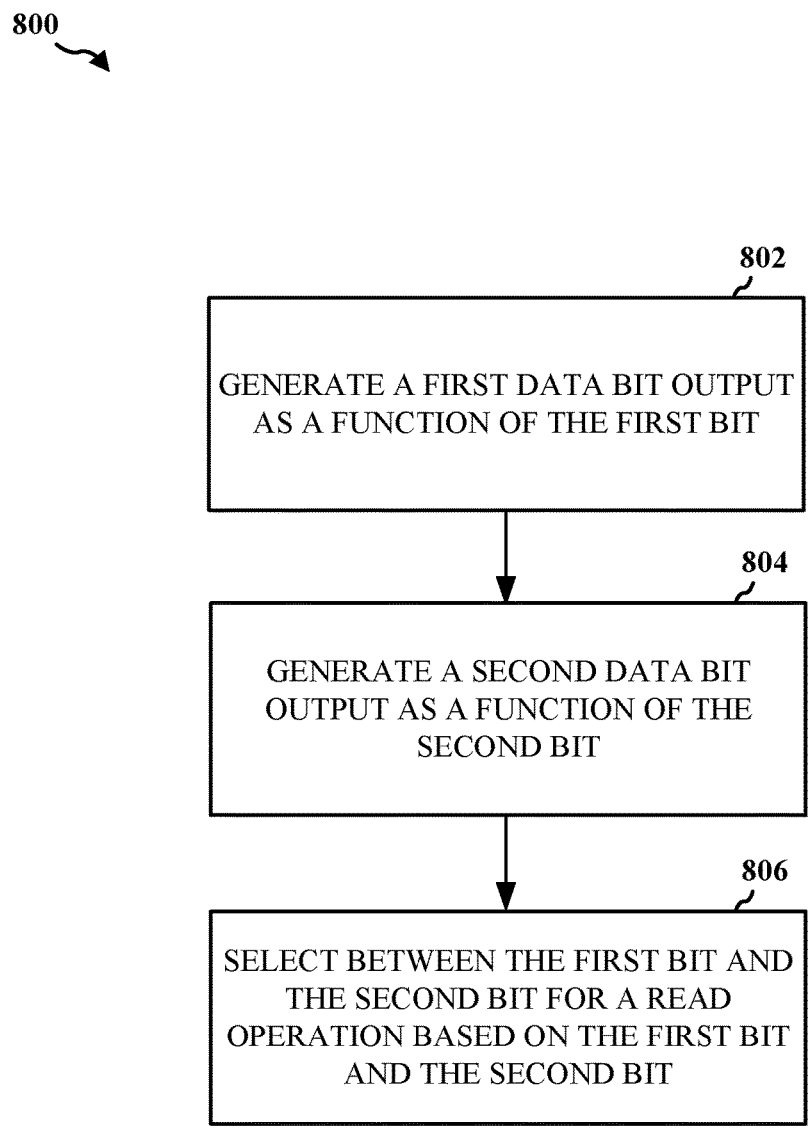
FIG. 8 is a flowchart of a method related to memory selection in accordance with the systems and methods described herein.

FIG. 8 is a flowchart 800 of a method related to memory selection in accordance with the systems and methods described herein. In block 802, generate a first data bit output (208) as a function of the first bit, e.g., within memory bank (202, 204). The first data bit output (208) may be generated by sense amplifier (312) and may be a function of data stored in a memory cell (314). The memory cell (314) may be accessed using row decoder (304) and column decoder (306) along with multiplexer (308) as illustrated in FIG. 3.

In block 804, generate a second data bit output (208) as a function of the second bit, e.g., within memory bank (202, 204). The first data bit output (208) may be generated by sense amplifier (312) and may be a function of data stored in a memory cell (314). The memory cell (314) may be accessed using row decoder (304) and column decoder (306) along with multiplexer (326) as illustrated in FIG. 3.

In block 806, select between the first bit and the second bit for a read operation based on the first bit and the second bit. The selection between the first bit and the second bit for the read operation may be performed using a switch (206, 206-1) that includes a latch. Furthermore, the selection between the first bit and the second bit for a read operation may use the switch (206, 206-1) that includes two cross-coupled gates (702, 704). One example may select between the first set of bits and the second set of bits for a read operation based on the first set of bits and the second set of bits.

Figure 9:
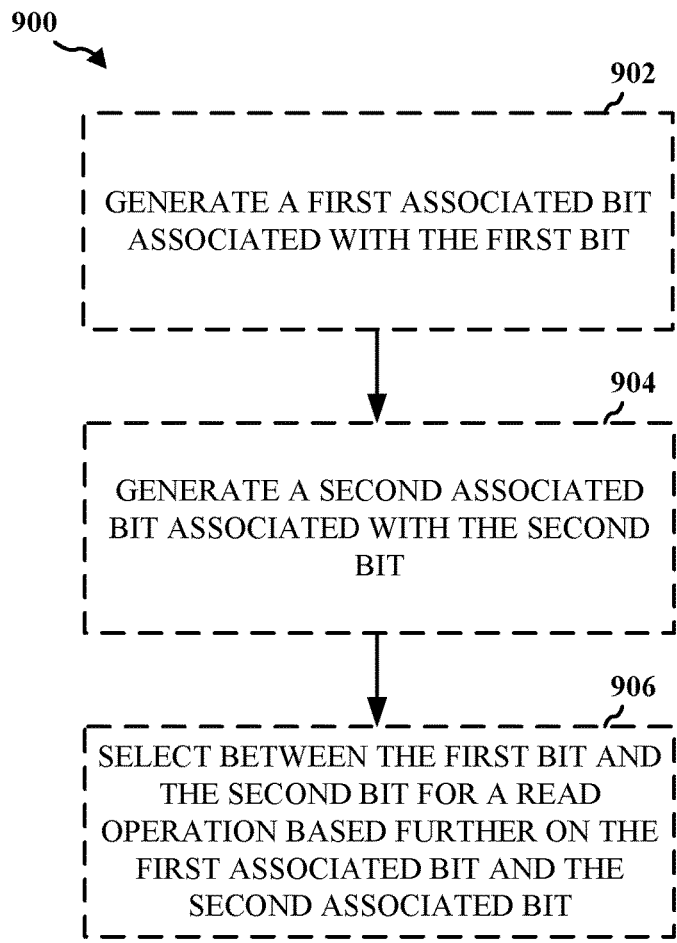
FIG. 9 is a flowchart of a method related to memory selection in accordance with the systems and methods described herein.

FIG. 9 is another flowchart 900 of a method related to memory selection in accordance with the systems and methods described herein. In a block 902, generate a first associated bit associated with the first bit. The first associated bit may be generated by an output of a memory cell (314, 316).

In a block 904, generate a second associated bit associated with the second bit. The second associated bit may be generated by an output of the memory cell (314, 316).

In a block 906, select (switch 206, 206-1) between the first bit and the second bit for a read operation based further on the first associated bit and the second associated bit. In the example methods of FIGS. 8 and 9, the selecting of the second bit based on the first bit and the first associated bit may be performed using a latch (switch 206-1). The selecting the first bit enabled by the second bit and the second associated bit using the latch. The latch may be further configured to be controlled by the second bit and the second associated bit when enabled by the first bit and first associated bit. The latch may be further configured to be controlled by the first bit and the first associated bit when enabled by the second bit and the second associated bit.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." No claim element is to be construed under the provisions of 35 U.S.C. § 112(f) unless the element is expressly recited using the phrase "means for" or, in the case of a method claim, the element is recited using the phrase "step for."

What is claimed is:

1. A memory, comprising:
   a first memory portion configured to store a first bit and generate a first data bit output, the first data bit output being a function of the first bit when a first read enable is active;
   a second memory portion configured to store a second bit and generate a second data bit output, the second data bit output being a function of the second bit when a second read enable is active; and
   a switch configured to select between the first and second bits for a read operation based on the first data bit output, the second data bit output, and internal feedback, wherein the first data bit output comprises a differential pair and wherein the switch is configured to select the first data bit output when the differential pair is complementary.

2. The memory of claim 1, wherein the switch comprises a latch.

3. The memory of claim 1, further comprising a first memory bank including the first memory portion and a second memory bank including the second memory portion.

4. The memory of claim 1, wherein the first memory portion comprises a first sense amplifier configured to generate the first data bit output, and wherein the second memory portion comprises a second sense amplifier configured to generate the second data bit output.

5. The memory of claim 4, wherein the first sense amplifier is configured to provide the first bit as the first data bit output when the first read enable is active, and wherein the second sense amplifier is configured to provide the second bit as the second data bit output when the second read enable is active.

6. The memory of claim 4, wherein the first sense amplifier is configured to force the first data bit output to a state independent of the first bit when the first read enable is inactive, and wherein the second sense amplifier is configured to force the second output to a state independent of the second bit when the second read enable is inactive.

7. The memory of claim 4, wherein the first sense amplifier is configured to provide the first bit as the first data bit output when the first read enable is active, and force the second data bit output to a state independent of the second bit when the second read enable is inactive.

8. The memory of claim 1, wherein the first data bit output comprises a differential pair and wherein the switch is configured to select the second data bit output when the differential pair is in the same state.

9. A method of accessing memory comprising:
   generating a first data bit output as a function of a first stored bit when a first read enable is active;
   generating a second data bit output as a function of a second stored bit when a second read enable is active; and
   selecting between the first and second bits for a read operation based on the first data bit output, the second data bit output, and internal feedback, wherein the first data bit output comprises a differential pair and wherein the selecting between the first and second bits comprises selecting the first data bit output when the differential pair is complementary.

10. The method of claim 9, wherein the generating a first data bit output comprises providing the first bit as the first data bit output when the first read enable is active; and wherein the generating the second data bit output comprises providing the second bit as the second data bit output when the second read enable is active.

11. The method of claim 9, wherein the generating the first data bit output comprises forcing the first data bit output to a state independent of the first bit when the first read enable is inactive; and wherein the generating the second data bit output comprises forcing the second output to a state independent of the second bit when the second read enable is inactive.

12. The method of claim 9, wherein the generating a first data bit output comprises providing the first bit as the first data bit output when the first read enable is active; and wherein the selecting between the first and second bits for a read operation based on the first and second data bit outputs comprises forcing the second data bit output to a state independent of the second bit when the second read enable is inactive.

13. The method of claim 9, wherein the first data bit output comprises a differential pair and wherein the selecting between the first and second bits comprises selecting the second data bit output when the differential pair is in the same state.

14. A memory comprising:
   means for storing a first bit;
   means for storing a second bit;
   means for generating a first data bit output as a function of the first bit when a first read enable is active;
   means for generating a second data bit output as a function of the second bit when a second read enable is active; and means for selecting between the first and second bits for a read operation based on the first data bit output, the second data bit output, and internal feedback, wherein the first data bit output comprises a differential pair and wherein the means for selecting between the first and second bits is configured to select the first data bit output when the differential pair is complementary.

15. The memory of claim 14 wherein the means for generating a first data bit output comprises a first sense amplifier, and the means for generating a second data bit output comprises a second sense amplifier.

16. The memory of claim 14 wherein the means for selecting between the first and second bits comprises a latch.

17. The memory of claim 14 further comprising a first memory bank comprising the means for storing the first bit and the means for generating the first data bit output, and a second memory bank comprising the means for storing the second bit and the means for generating the second data bit output.

18. The memory of claim 14, wherein the means for generating a first data bit output is configured to provide the first bit as the first data bit output when the first read enable is active; and wherein the means for generating the second data bit output is configured to provide the second bit as the second data bit output when the second read enable is active.

19. The memory of claim 14, wherein the means for generating a first data bit output is configured to force the first data bit output to a state independent of the first bit when the first read enable is inactive; and wherein the means for generating the second data bit output is configured to force the second output to a state independent of the second bit when the second read enable is inactive.

20. The memory of claim 14, wherein the means for generating a second data bit output provides the first bit as the first data bit output when the first read enable is active; and forces the second data bit output to a state independent of the second bit when the second read enable is inactive.

21. The memory of claim 14, wherein the first data bit output comprises a differential pair and wherein the means for selecting between the first and second bits is configured to select the second data bit output when the differential pair is in the same state.

* * * * *